United States Patent
Lu et al.

(10) Patent No.: US 8,664,728 B2
(45) Date of Patent: Mar. 4, 2014

(54) POWER TRANSISTOR WITH PROTECTED CHANNEL

(75) Inventors: Yang Lu, Fremont, CA (US); Budong You, Fremont, CA (US); Marco A. Zuniga, Palo Alto, CA (US); Hamza Yilmaz, Saratoga, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 541 days.

(21) Appl. No.: 12/353,866

(22) Filed: Jan. 14, 2009

(65) Prior Publication Data

US 2009/0224333 A1    Sep. 10, 2009

Related U.S. Application Data

(60) Provisional application No. 61/021,009, filed on Jan. 14, 2008.

(51) Int. Cl.
*H01L 27/105* (2006.01)
*H01L 21/265* (2006.01)
*H01L 29/78* (2006.01)

(52) U.S. Cl.
USPC ............ 257/392; 257/E21.356; 257/E21.427; 257/107; 257/120; 257/139

(58) Field of Classification Search
USPC .......... 257/392, E21.356, E21.427, 107, 120, 257/139, 341
See application file for complete search history.

(56) References Cited

U.S. PATENT DOCUMENTS

| | | |
|---|---|---|
| 6,433,614 B1 | 8/2002 | You et al. |
| 2002/0050619 A1 | 5/2002 | Kawaguchi et al. |
| 2002/0053695 A1 | 5/2002 | Liaw et al. |
| 2003/0122160 A1 | 7/2003 | Houston et al. |
| 2005/0227448 A1 | 10/2005 | Chen et al. |
| 2006/0022294 A1 | 2/2006 | Petzold et al. |
| 2007/0207600 A1* | 9/2007 | You et al. ...................... 438/527 |
| 2008/0061368 A1* | 3/2008 | Williams et al. .............. 257/336 |

FOREIGN PATENT DOCUMENTS

| | | |
|---|---|---|
| JP | 10506755 | 6/1998 |
| JP | 2003-31805 | 1/2003 |
| JP | 2006-108208 | 4/2006 |
| JP | 2006-286800 | 10/2006 |
| KR | 10-1999-0038946 | 6/1999 |
| WO | WO 96/10267 | 4/1996 |

OTHER PUBLICATIONS

Chung, Doo Han, Authorized Officer, Korean Intellectual Property Office, International Search Report and the Written Opinion of the International Searching Authority for Application No. PCT/US2009/031019, dated Aug. 6, 2009, 11 pages.
European Patent Office, European Search Report dated Jun. 24, 2011 for Application No. 09703043.1, 6 pages.
Office Action for European Application No. 09 703 043.1, dated Apr. 17, 2012, 5 pages.
Japanese Office Action for Japanese Patent Application No. P2010-542433, filed Jan. 14, 2009. 4 pages.

* cited by examiner

*Primary Examiner* — Cathy N Lam
(74) *Attorney, Agent, or Firm* — Fish & Richardson P.C.

(57) ABSTRACT

A transistor includes a substrate, a well formed in the substrate, a drain including a first impurity region implanted in the well, a source including a second impurity region implanted in the well and spaced apart from the first impurity region, a channel for current flow from the drain to the source, and a gate to control a depletion region between the source and the drain The channel has an intrinsic breakdown voltage, and the well, drain and source are configured to provide an extrinsic breakdown voltage lower than the intrinsic breakdown voltage and such that breakdown occurs in a breakdown region in the well located outside the channel and adjacent the drain or the source.

38 Claims, 6 Drawing Sheets

POWER TRANSISTOR WITH PROTECTED CHANNEL

CROSS-REFERENCE TO RELATED APPLICATIONS

This application claims priority to U.S. Provisional Application Ser. No. 61/021,009, filed on Jan. 14, 2008, the entire contents of which are incorporated by reference.

BACKGROUND

The present disclosure relates to semiconductor devices.

Voltage regulators, such as DC to DC converters, are used to provide stable voltage sources for electronic systems. Switching voltage regulators (or simply "switching regulators") are known to be an efficient type of DC to DC converter. A switching regulator generates an output voltage by converting an input DC voltage into a high frequency voltage signal, and filtering the high frequency input voltage signal to generate the output DC voltage. Specifically, the switching regulator includes a switch for alternately coupling and decoupling an input DC voltage source, such as a battery, to a load, such as an integrated circuit. An output filter, typically including an inductor and a capacitor, is coupled between the input voltage source and the load to filter the output of the switch and thus provide the output DC voltage. A controller, such as a pulse width modulator or a pulse frequency modulator, controls the switch to maintain a substantially constant output DC voltage.

LDMOS transistors are used in switching regulators as a result of their performance in terms of a tradeoff between their specific on-resistance ($R_{dson}$) and drain-to-source breakdown voltage ($BV_{d\_s}$). On-resistance ($R_{dson}$) versus the long-term reliability of device is another performance tradeoff.

Referring to FIG. 1, a conventional LDMOS transistor 300 includes a p-type substrate 302 in which is formed a high-voltage n-type well (HV n-well) 304. In the HV n-well are a source region 310 with an n-doped n+ region 312, a p-doped p+ region 314, and a p-doped p-body diffusion (p-body) 316, a drain region 320 with an n-doped n+ region 322 and a more lightly doped n-type doped drain (NDD) 324, and a gate 330 with a gate oxide 332 and a polysilicon layer 334.

In this conventional LDMOS design, a region 340 in the NDD under the gate 330 that is between the n+ region 312 and the HV n-well 304 experiences the highest electrical field due to the depletion region that is developed to support the high drain voltage potential. Because the region 340 is in the current path during the conduction state, significant engineering effort has been made to minimize this high-resistance region. However, minimizing the high-resistance region further increases the electrical field gradient and can result in a high impact ionization rate. Thus, in a conventional LDMOS design, region 340 is the location where device breakdown happens during the off-state.

When breakdown happens at the region 340, a large quantity of holes and electrons are generated in this region 340. These carriers can easily get trapped in the drain-side gate oxide of the device due to their high energy, and cause intrinsic device characteristic degradation and long-term reliability problem such as FET on-resistance degradation. One technique used to avoid intrinsic breakdown in the power LDMOS device is to include a second device with lower breakdown voltage in parallel with the LDMOS device to clamp the drain voltage of LDMOS device. However, such an approach results in a complex system and higher component count and cost.

SUMMARY

In one aspect, a transistor includes a p-type substrate having a p-type body, an n-well formed in the substrate, a source formed in the n-well, a drain formed in the n-well and spaced apart from the source, a channel region for current flow from the drain to the source, a gate to control channel formation in the channel region between the source and the drain, and a breakdown region in the high-voltage n-well outside the channel region. The source includes a p-doped p-body, a p-doped p+ region within the p-body, and a first n-doped n+ region within the p-body. The drain includes a second n-doped n+ region. The breakdown region is between the p-body and the p-type body of the substrate. The channel region has an intrinsic breakdown voltage, and the breakdown region has an extrinsic breakdown voltage lower than the intrinsic breakdown voltage.

In another aspect, a transistor includes a p-type substrate having a p-type body, an n-well formed in the substrate, a source formed in the n-well, a drain formed in the n-well and spaced apart from the source, a channel region for current flow from the drain to the source, a gate to control channel formation in the channel region between the source and the drain, and a breakdown region in the high-voltage n-well outside the channel region. The source includes a p-doped p-body, a p-doped p+ region within the p-body, and a first n-doped n+ region within the p-body. The drain including a second n-doped n+ region. The breakdown region is between the second n-doped n+ region and the p-type body of the substrate. The channel region has an intrinsic breakdown voltage, and the breakdown region having an extrinsic breakdown voltage lower than the intrinsic breakdown voltage.

Implementations of either of the above aspects may include one or more of the following features. A field oxide on the substrate may surround the n-well and extend over a portion of the n-well. The field oxide may extends over a portion of the p-body. The drain may include an n-doped region that surrounds and is more lightly doped than the second n-doped n+ region. The field oxide may extend over a portion of the n-doped region. The first n-doped n+ region may abut the p+ region. The channel may extend along a first direction and the breakdown region may extend along a second direction perpendicular to the first direction. The intrinsic breakdown voltage may be not more than about 10% greater than the extrinsic breakdown voltage. The intrinsic breakdown voltage may be about 1-2 volts greater than the extrinsic breakdown voltage. The drain may be a distributed drain with a plurality of drain regions each including the second n-doped n+ region, and the gate may include a plurality of gates lines to control a plurality of depletion regions between the source and the drain regions. The source may be a distributed source with a plurality of source regions each including the p-body, the p+ region and the second n-doped n+ region, and the gate may include a plurality of gates lines to control a plurality of depletion regions between the source regions and the drain.

In another aspect, a transistor includes a substrate, a well formed in the substrate, a drain including a first impurity region implanted in the well, a source including a second impurity region implanted in the well and spaced apart from the first impurity region, a channel for current flow from the drain to the source, and a gate to control a depletion region between the source and the drain The channel has an intrinsic breakdown voltage, and the well, drain and source are configured to provide an extrinsic breakdown voltage lower than the intrinsic breakdown voltage and such that breakdown occurs in a breakdown region in the well located outside the channel and adjacent the drain or the source.

Implementations may include one or more of the following features. The drain may be a distributed drain with a plurality of drain regions each including the first impurity region, the source may be a distributed source with a plurality of source regions each including the second impurity region, and the gate may include a plurality of gates lines to control a plurality of depletion regions between the source regions and the drain regions. The plurality of drains and the plurality of sources may be arranged in alternating rows. The rows may extend along a first direction, and the breakdown region in the high-voltage well may extends along a second direction perpendicular to the first direction. The breakdown region in the well may be at an end of the rows. The drain may be a distributed drain with a plurality of drain regions each including the first impurity region, and the gate may include a plurality of gates lines to control a plurality of depletion regions between the source and the drain regions. The source may be a distributed source with a plurality of source regions each including the second impurity region, and the gate may include a plurality of gates lines to control a plurality of depletion regions between the source regions and the drain. The substrate may be a p-type substrate and the well may be an n-type well. The first impurity region may be an n-doped n+ region n+ and the second impurity region may be an n-doped n+ region n+. The source may include a p-doped p+ region. The source may include a p-doped p-body, the first impurity region and the p-doped p+ region formed within the p-body. The breakdown region in the high-voltage well may be located adjacent the p-body. The drain may include a n-doped region that surrounds and is more lightly doped than the second n-doped n+ region. A field oxide on the substrate may surround the n-well and may extend over a portion of the p-body. A field oxide on the substrate may surround the high-voltage well and may extend over a portion of the high-voltage well. The intrinsic breakdown voltage may be not more than about 10% greater than the extrinsic breakdown voltage. The intrinsic breakdown voltage may be about 1-2 volts greater than the extrinsic breakdown voltage. The gate may include a first conductive region and a second conductive region electrically isolated and independently biased from the first conductive region, the first conductive region to control channel formation over a p-body in the source, the second conductive region to control an electric potential in the region of intrinsic breakdown.

In another aspect, a method of fabricating a transistor includes selecting dimensions and concentrations for impurity regions in a source and a drain of the transistor, selecting an n-well concentration of an n-well in which the source and drain will be formed, selecting a distance between the impurity regions of source and the drain, determining an intrinsic breakdown voltage of a channel between the source and the drain from the dimension, concentrations, distance and n-well concentration, and selecting a width of a portion of the n-well extending past the source to provide such that the portion of the n-well has an extrinsic breakdown voltage lower than the intrinsic breakdown voltage.

Implementations may include one or more of the following. The substrate may be implanted with the impurity regions having the selected dimensions and concentrations and implanted with the n-well having the selected n-well concentration and width.

Implementations may include one or more of the following advantages. When breakdown occurs, electron-hole pairs generated by impact ionization may be located away from the intrinsic channel region. As a result, FET on-resistance need not degrade as a result of avalanche breakdown. This may be achieved without sacrificing significant silicon area.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

In general, this disclosure concerns a power device with inherent self-protection capability. That is, the device is designed such that when breakdown occurs, electrode-hole pairs generated by impact ionization will occur away from the intrinsic channel region (the explicit current path from the n+ of the drain to the n+/p+ of the source).

In general, the power device takes advantage of the fact that power-LDMOS is not a one-dimensional device in the application. In particular, the device can be designed so that the channel follows a first path (e.g., in a first direction), whereas breakdown occurs along a second path (e.g., in a perpendicular second direction).

Figure 1:
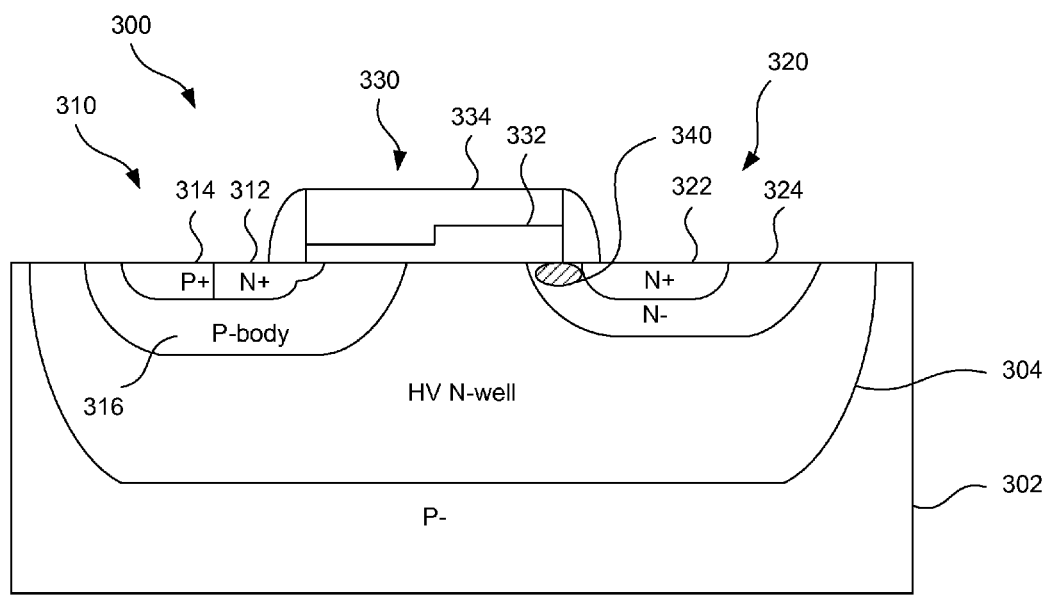
FIG. 1 is a cross-sectional view of a conventional LDMOS transistor.
Figure 2:
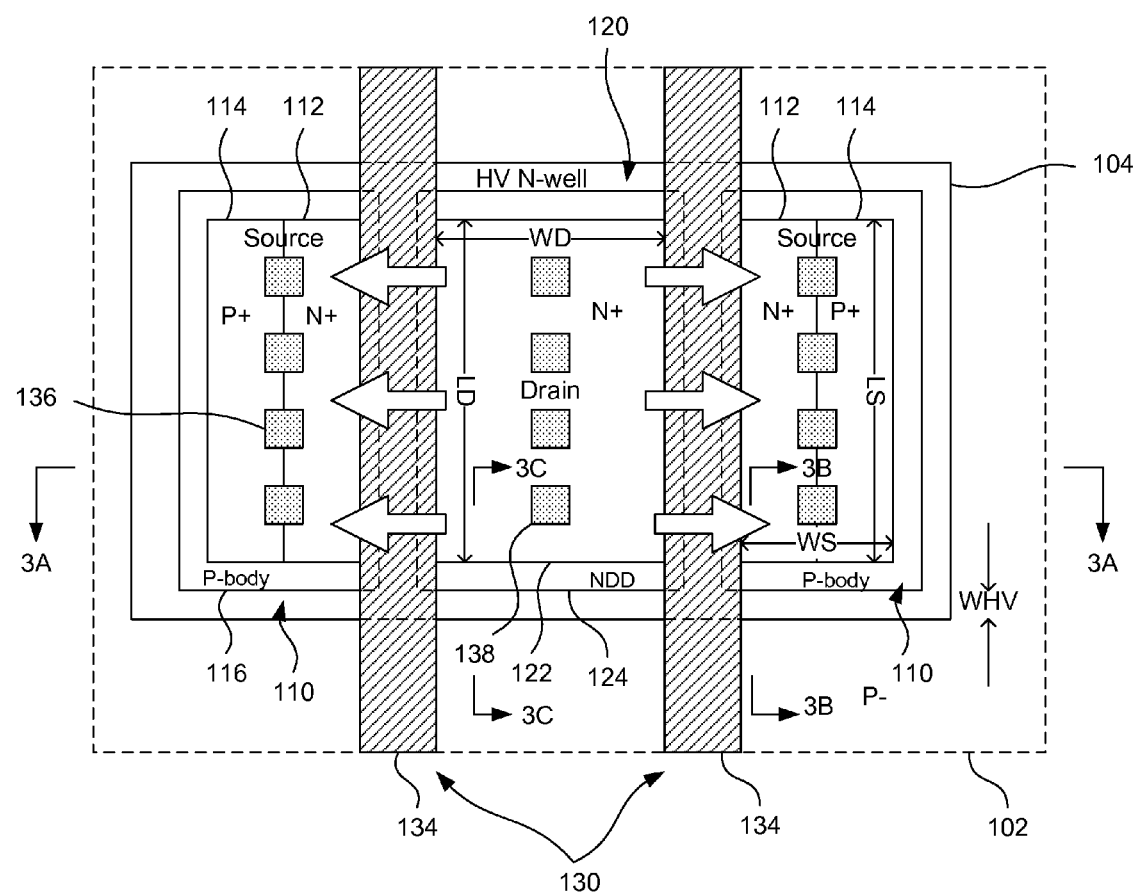
FIG. 2 is a plan view of an implementation of an LDMOS transistor.

FIG. 2 is a plan view of an LDMOS device 100. The LDMOS transistor 100 includes a p-type substrate 102 in which is formed a high-voltage n-type well (HV n-well) 104. In the HV n-well are source regions 110 and drain regions 120 separated by gates 130. The source regions 110 can be extended, with a length LS along the gate that is greater than their width WS in the orthogonal direction. Similarly, the drain regions 120 can be extended, with a length LD along the gate that is greater than their width WD in the orthogonal direction. The dimensions can be measured from the boundaries of the highly doped regions.

The source regions 110 and drain regions 120 can be arranged in alternating rows, each row separated by a gate 130. Although only one drain region 120 is illustrated, the pattern could repeat with more than one drain region 120. Similarly, although only two source regions 110 are illustrated, the pattern could repeat with more than two source regions 110. Also, there could be two drain regions 120 disposed on opposite sides of a single source region 110. In operation, current flows from the drain to the source (as shown by the arrows) through the channel that extends along the length of the gate. In some implementations, the length of the source region is equal to the length of the drain region.

Figure 3A:
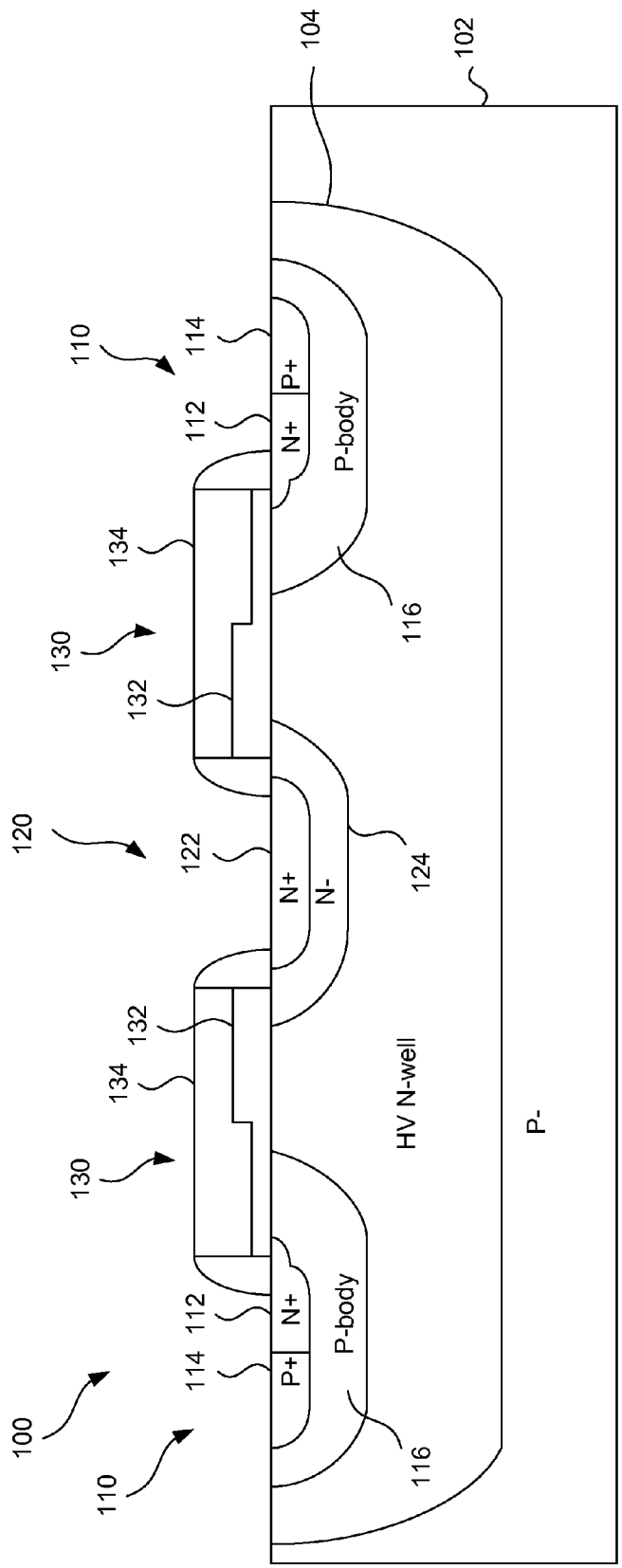
FIGS. 3A, 3B and 3C are cross-sectional views of the LDMOS transistor of FIG. 2.

FIG. 3A is a cross-sectional view that is parallel to the width of the source and drain regions. Each gate 130 includes a gate oxide layer 132 and a conductive layer 134, e.g., a polysilicon layer, over the oxide layer 132. In some implementations, the gate oxide can include a thicker region closer to the adjacent drain 120 and a thinner region closer to the adjacent source 110. Each gate can be tied to a common control voltage.

The source region 110 includes an n-doped n+ region 112, a p-doped p+ region 114, and a p-doped p-body diffusion (p-body) 116. Both the n+ region 112 and the p+ region 114 are surrounded by the p-body 116. The n+ region 112 and p+ region 114 abut, with the n+ region closer to the drain region 120. The p-body 116 has a lower concentration of impurities than the p+ region 114. The p-body 116 and the n+ region 112 (e.g., a shallow doped region implanted before the oxide sidewalls) can extend under the gate oxide 132, with the p-body extending farther than the n+ region. Electrical connection to the n+ region 112 and p+ region 114 can be made by contact pads 136 (see FIG. 2) in an overlying metal layer. In some implementations, individual contact pads contact both the n+ region 112 and p+ region 114.

The drain region 120 includes an n-doped n+ region 122 and a more lightly doped n-type doped drain (NDD) 124. The n+ region 122 is surrounded by the NDD 124. The NDD can extend under the gate oxide 132. Electrical connection to the n+ region 122 can be made by contact pads 138 (see FIG. 2) in an overlying metal layer.

The HV n-well 104 has a lower concentration of impurities than the n+ regions 112, 122 and the NDD 124.

Figure 3B:
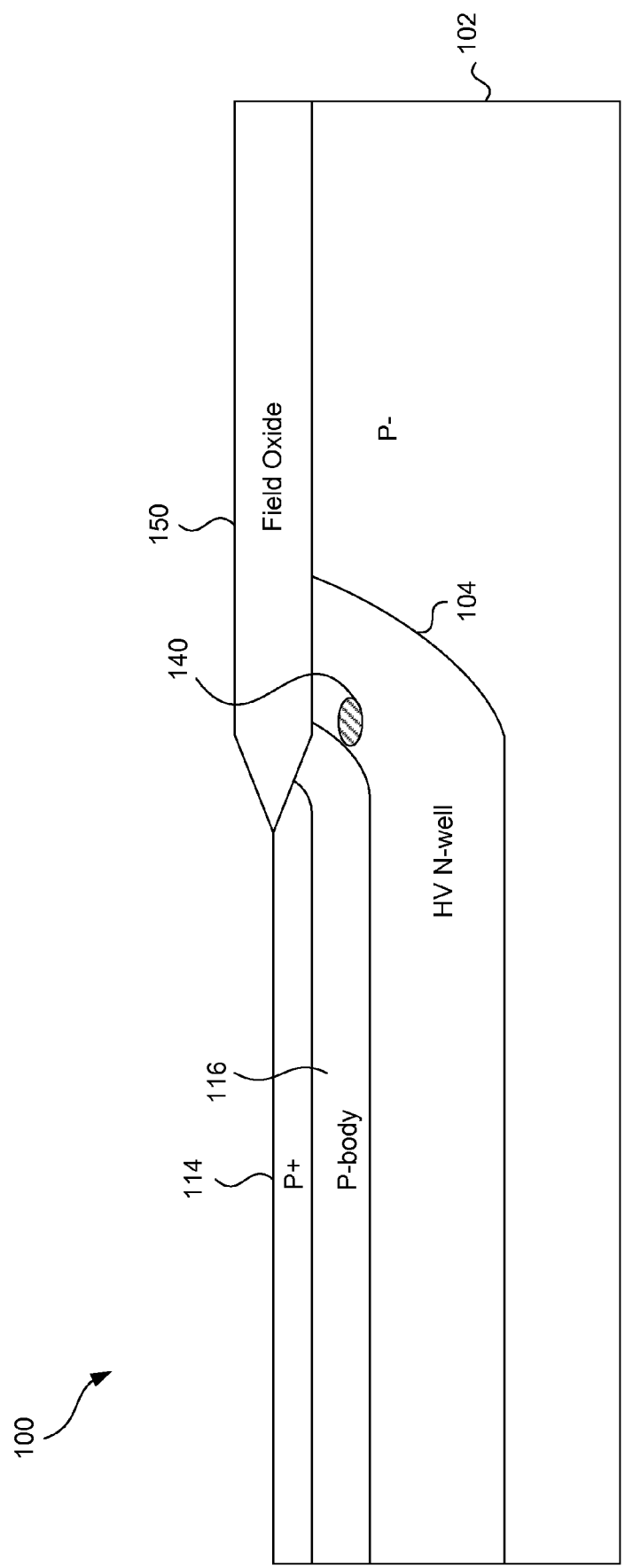

FIG. 3B is a partial cross-sectional view parallel to the length of the source, e.g., parallel to the gate line, that passes through the p+ region 114. The p-body 116 can extend farther than the p+ region 114 in the direction parallel to the gate line. Similarly, the HV n-well 104 can extend farther than the p-body 116 in the direction parallel to the gate line.

A portion of the substrate outside the active area can be covered by a field oxide 150. Both the p-body 116 and the HV n-well 104 can extend beneath the field oxide 150 in the region proximate the source 110. The field oxide 150 can completely surround the HV n-well 104. Although not illustrated, a conductive contact can be placed in direct contact with the p-type substrate 102 to provide a substrate electrode at a location beyond the field oxide 150.

As shown, a termination region 140 includes a portion of the HV n-well 104 that is sandwiched between the p-body 116 and the p-type substrate 102. Since this is at the lateral edge of the source region 110 (as opposed to the edge abutting the gate 130), this region does not serve as a channel.

Figure 3C:
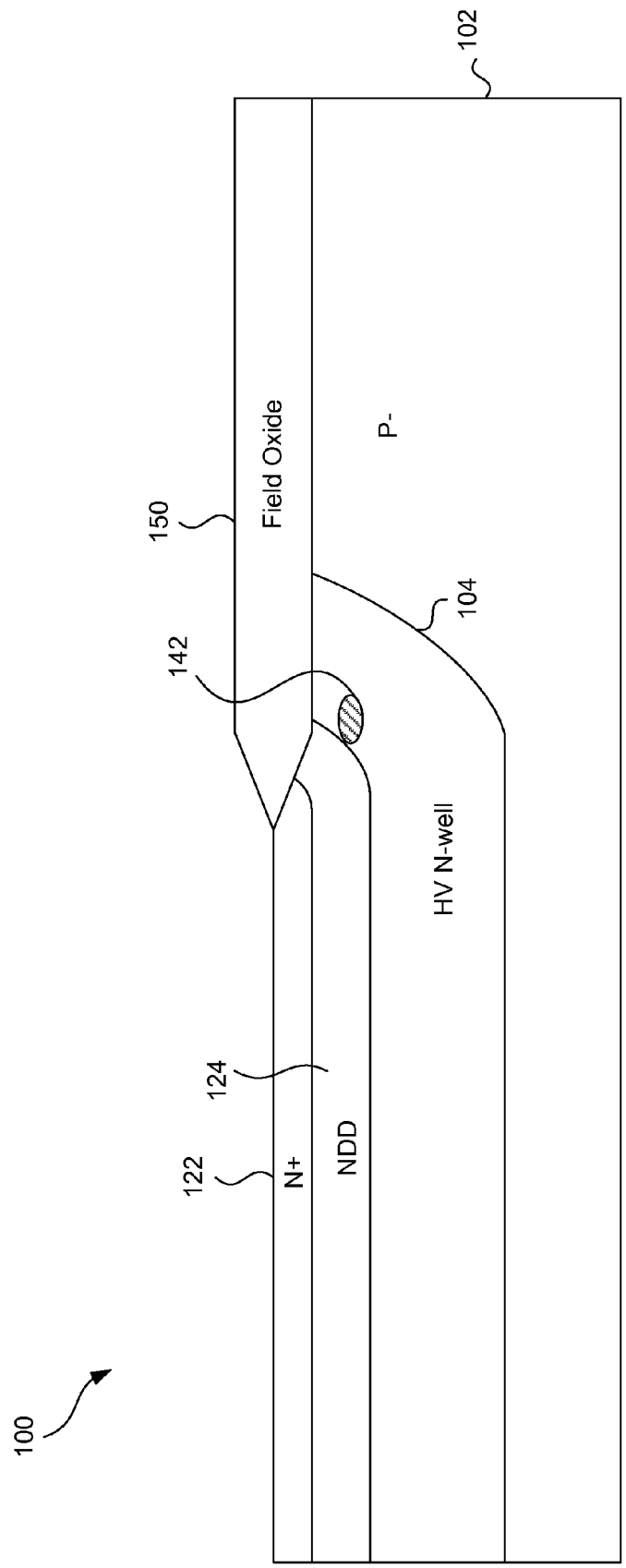

FIG. 3C is a partial cross-sectional view parallel to the length of the drain, e.g., parallel to the gate line, that passes through the n+ region 122. The NDD 124 can extend farther than the n+ region 122 in the direction parallel to the gate line. Similarly, the HV n-well 104 can extend farther than the NDD 124 in the direction parallel to the gate line.

As noted above, a portion of the substrate outside the active area can be covered by a field oxide 150. Both the NDD 124 and the HV n-well 104 can extend beneath the field oxide 150 in the region proximate the drain 120.

As shown, a termination region 142 includes a portion of the HV n-well 104 that is sandwiched between the NDD 124 and the p-type substrate 102. Since this is at the lateral edge of the drain region 110 (as opposed to the edge abutting the gate 130), this region does not serve as a channel.

The device is engineered so that the drain to body extrinsic breakdown voltage (e.g., from the p-body to the p-type body of the substrate, e.g., along the 3B-3B cross-section) is slightly lower than the intrinsic breakdown voltage of the device (through the channel, e.g., along the 3A-3A cross-section). The width WHV of HV n-well 104 between the p-body 116 and the p-type substrate 102, along with the concentrations of the various impurity regions, can be selected so that the breakdown voltage in the termination region 140 is lower than the breakdown voltage in the channel. Alternatively or in addition, the width WHV of HV n-well 104 between the NDD 124 and the p-type substrate 102, along with the concentrations of the various impurity regions, can be selected so that the breakdown voltage in the termination region 142 is lower than the breakdown voltage in the channel, so that extrinsic breakdown voltage (e.g., from the NDD to the p-type body of the substrate, e.g., along the 3C-3C cross-section) is slightly lower than the intrinsic breakdown voltage of the device. By doing so, when breakdown happens, electron-hole pairs generated by impact ionization will be located away from the intrinsic channel region. As a result, FET on-resistance will no longer degrade as a result of avalanche breakdown.

In addition, although FIGS. 3B and 3C illustrate the breakdown regions 140 and 142 on the sides of the source and drain, respectively, that run perpendicular to the gate line, the breakdown region could be under the gate 134, but still not in the intrinsic channel, e.g., the breakdown region could be in a portion of the HV n-well 104 that is between NDD 124 and adjacent P-body 114, but not between the n+ region 122 of the drain 120 and the adjacent n+ region 114 of the source 110, or in a portion of the HV n-well 104 that underlies the gate 134 but is not between the NDD 124 and P-body 114. Moreover, for the outermost source or drain region in the array, it might be possible to create a breakdown region on the side of the source or drain that runs parallel to the gate line 134 but is farther from the gate and associated channel.

As a first order estimation, the difference in breakdown voltage (delta-BV) between the extrinsic path and the intrinsic path can be determined by the product of the maximum current in a breakdown event and the series resistance of the extrinsic breakdown path. The difference in breakdown voltage (delta-BV) can be selected to be less than 10% of the extrinsic breakdown voltage. For example, if the breakdown voltage for a device is about 30 volts, then the concentrations and dimensions of the implanted regions can be selected such that the extrinsic breakdown voltage is about 30 volts and the intrinsic breakdown voltage is about 32 volts. Thus, this new methodology of device engineering achieves self-protection on the device, at a slight cost of delta-BV (1~2V) in the breakdown voltage value but without sacrificing any significant silicon area.

One example of an approach to achieve this intrinsic and extrinsic breakdown voltage difference is described as follows. The intrinsic breakdown voltage can be engineered to the value of desired breakdown by the well-known practices in power LDMOS design. While the extrinsic breakdown voltage in this particular device structure can be tuned to the value of desired breakdown voltage minus delta-BV by adjusting the width of high-voltage N-well sandwiched between two P-type regions at the same potential.

Figure 4:
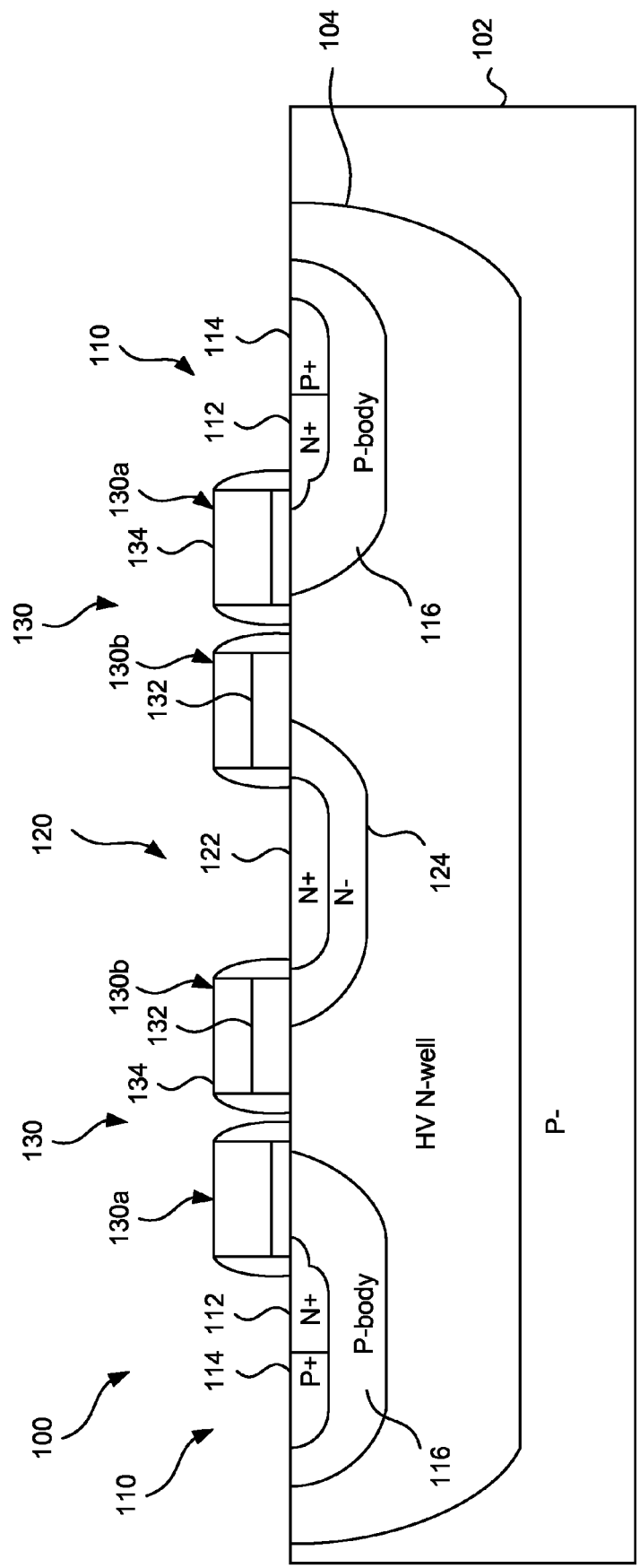
FIG. 4 is a cross-sectional views of another implementation of an LDMOS transistor.

FIG. 4 illustrates another implementation in which each gate region 130 includes two electrically isolated gates 130a, 130b, that can be biased to different potentials. Each gate 130a, 130b includes a gate oxide layer 132 and a conductive layer 134, e.g., a polysilicon layer, over the oxide layer 132. The gates 130a, 130b can extend in parallel. The gate 130a closer to the source 110 is positioned over the portion of the p-body 116 that projects past the n+ region 112, and thus can control channel formation through the p-body 116. The gate 130b closer to the drain is positioned over a portion of the NDD 124 that extends past the n+ region 122 and over the remainder of the channel (which can be undoped except for the HV N-well 104), and thus can control the voltage potential in the region of intrinsic breakdown. Thus, selection of the voltages on the gates 130a, 130b permits selection of both the breakdown voltage value and the location of the breakdown.

A number of embodiments of the invention have been described. Nevertheless, it will be understood that various modifications may be made without departing from the spirit and scope of the invention. For example, although P-type body and P-type substrate are described, the P-type substrate could be replaced by other available P-type implantation. Accordingly, other embodiments are within the scope of the following claims.

What is claimed is:

1. A transistor comprising:
    a p-type substrate having a p-type body;
    an n-well formed in the substrate;
    a source formed in the n-well including
        a p-doped p-body,
        a p-doped p+ region within the p-body, and
        a first n-doped n+ region within the p-body;
    a drain formed in the n-well and spaced apart from the source, the drain including a second n-doped n+ region;
    a channel region for current flow from the drain to the source, the channel region having an intrinsic breakdown voltage;
    a gate to control channel formation in the channel region between the source and the drain; and
    a breakdown region in the n-well between the p-body and the p-type body of the substrate outside the channel region, wherein doping and dimensions of the breakdown region and channel region are such that an extrinsic breakdown voltage of the breakdown region is lower than the intrinsic breakdown voltage.

2. The transistor of claim 1, further comprising a field oxide on the substrate surrounding the n-well and extending over a portion of the n-well.

3. The transistor of claim 2, wherein the field oxide extends over a portion of the p-body.

4. The transistor of claim 1, wherein the intrinsic breakdown voltage is not more than about 10% greater than the extrinsic breakdown voltage.

5. The transistor of claim 1, wherein the intrinsic breakdown voltage is about 1-2 volts greater than the extrinsic breakdown voltage.

6. The transistor of claim 1, wherein the drain includes an n-doped region that surrounds the second n-doped n+ region and is more lightly doped than the second n-doped n+ region.

7. The transistor of claim 1, wherein the first n-doped n+ region abuts the p+ region.

8. The transistor of claim 1, wherein the channel region extends along a first direction and the breakdown region extends along a second direction perpendicular to the first direction.

9. The transistor of claim 1, wherein the drain is a distributed drain with a plurality of drain regions each including the second n-doped n+ region, and the gate includes a plurality of gates lines to control a plurality of depletion regions between the source and the drain regions.

10. The transistor of claim 1, wherein the source is a distributed source with a plurality of source regions each including the p-body, the p+ region and the second n-doped n+ region, and the gate includes a plurality of gates lines to control a plurality of depletion regions between the source regions and the drain.

11. A transistor comprising:
    a p-type substrate having a p-type body;
    an n-well formed in the substrate;
    a source formed in the n-well including
        a p-doped p-body,
        a p-doped p+ region within the p-body, and
        a first n-doped n+ region within the p-body;
    a drain formed in the n-well and spaced apart from the source, the drain including a second n-doped n+ region;
    a channel region for current flow from the drain to the source, the channel region having an intrinsic breakdown voltage;
    a gate to control channel formation in the channel region between the source and the drain; and
    a breakdown region in the n-well between the second n-doped n+ region and the p-type body of the substrate outside the channel region, wherein doping and dimensions of the breakdown region and channel region are such that an extrinsic breakdown voltage of the breakdown region is lower than the intrinsic breakdown voltage.

12. The transistor of claim 11, wherein the intrinsic breakdown voltage is not more than about 10% greater than the extrinsic breakdown voltage.

13. The transistor of claim 11, wherein the intrinsic breakdown voltage is about 1-2 volts greater than the extrinsic breakdown voltage.

14. The transistor of claim 11, further comprising a field oxide on the substrate surrounding the n-well and extending over a portion of the n-well.

15. The transistor of claim 14, wherein the drain includes an n-doped region that surrounds the second n-doped n+ region and is more lightly doped than the second n-doped n+ region.

16. The transistor of claim 15, wherein the field oxide extends over a portion of the n-doped region.

17. The transistor of claim 11, wherein the first n-doped n+ region abuts the p+ region.

18. The transistor of claim 11, wherein the channel region extends along a first direction and the breakdown region extends along a second direction perpendicular to the first direction.

19. The transistor of claim 11, wherein the drain is a distributed drain with a plurality of drain regions each including the second n-doped n+ region, and the gate includes a plurality of gates lines to control a plurality of depletion regions between the source and the drain regions.

20. The transistor of claim 11, wherein the source is a distributed source with a plurality of source regions each including the p-body, the p+ region and the second n-doped n+ region, and the gate includes a plurality of gates lines to control a plurality of depletion regions between the source regions and the drain.

21. A transistor comprising:
    a substrate;
    a well formed in the substrate;
    a drain including a first impurity region implanted in the well;
    a source including a second impurity region implanted in the well and spaced apart from the first impurity region;
    a channel for current flow from the drain to the source, the channel having an intrinsic breakdown voltage; and
    a gate to control a depletion region between the source and the drain;
    a breakdown region in the well located outside the channel and adjacent the drain or the source, wherein doping and dimensions of the well, drain and source are configured such that an extrinsic breakdown voltage of the breakdown is lower than the intrinsic breakdown voltage so that breakdown occurs in the breakdown region in the well located outside the channel and adjacent the drain or the source.

22. The transistor of claim 21, wherein the drain is a distributed drain with a plurality of drain regions each including the first impurity region, the source is a distributed source with a plurality of source regions each including the second impurity region, and the gate includes a plurality of gates lines to control a plurality of depletion regions between the source regions and the drain regions.

23. The transistor of claim 22, wherein the plurality of drain regions and the plurality of source regions are arranged in alternating rows.

24. The transistor of claim 23, wherein the rows extend along a first direction, and the breakdown region extends along a second direction perpendicular to the first direction.

25. The transistor of claim 23, wherein the breakdown region in the well is at an end of the rows.

26. The transistor of claim 21, wherein the drain is a distributed drain with a plurality of drain regions each including the first impurity region, and the gate includes a plurality of gates lines to control a plurality of depletion regions between the source and the drain regions.

27. The transistor of claim 21, wherein the source is a distributed source with a plurality of source regions each including the second impurity region, and the gate includes a plurality of gates lines to control a plurality of depletion regions between the source regions and the drain.

28. The transistor of claim 21, wherein the substrate is a p-type substrate and the well is an n-type well.

29. The transistor of claim 28, wherein the first impurity region is a first n-doped n+ region n+ and the second impurity region is a second n-doped n+ region.

30. The transistor of claim 29, wherein the source includes a p-doped p+ region.

31. The transistor of claim 30, wherein the source includes a p-doped p-body, the first impurity region and the p-doped p+ region formed within the p-body.

32. The transistor of claim 31, wherein the breakdown region is located adjacent the p-body.

33. The transistor of claim 31, wherein the drain includes a n-doped region that surrounds and is more lightly doped than the second n-doped n+ region.

34. The transistor of claim 31, further comprising a field oxide on the substrate surrounding the n-type well and extending over a portion of the p-body.

35. The transistor of claim 21, further comprising a field oxide on the substrate surrounding the high-voltage well and extending over a portion of the well.

36. The transistor of claim 21, wherein the intrinsic breakdown voltage is not more than about 10% greater than the extrinsic breakdown voltage.

37. The transistor of claim 21, wherein the intrinsic breakdown voltage is about 1-2 volts greater than the extrinsic breakdown voltage.

38. The transistor of claim 21, where the gate includes a first conductive region and a second conductive region electrically isolated and independently biased from the first conductive region, the first conductive region to control channel formation over a p-body in the source, the second conductive region to control an electric potential in the region of intrinsic breakdown.

* * * * *